(12) United States Patent
Hasegawa et al.

(10) Patent No.: US 12,347,513 B2
(45) Date of Patent: Jul. 1, 2025

(54) SEMICONDUCTOR MEMORY DEVICE

(71) Applicant: Kioxia Corporation, Tokyo (JP)

(72) Inventors: Keita Hasegawa, Yokkaichi Mie (JP); Keisuke Nakatsuka, Kobe Hyogo (JP)

(73) Assignee: KIOXIA CORPORATION, Tokyo (JP)

(*) Notice: Subject to any disclaimer, the term of this patent is extended or adjusted under 35 U.S.C. 154(b) by 495 days.

(21) Appl. No.: 17/901,590

(22) Filed: Sep. 1, 2022

(65) Prior Publication Data
US 2023/0307011 A1    Sep. 28, 2023

(30) Foreign Application Priority Data

Mar. 23, 2022 (JP) .................. 2022-047336

(51) Int. Cl.
| | | |
|---|---|---|
| H01L 29/76 | (2006.01) | |
| G11C 5/06 | (2006.01) | |
| H01L 23/522 | (2006.01) | |
| H01L 23/528 | (2006.01) | |
| H10B 41/27 | (2023.01) | |
| H10B 43/27 | (2023.01) | |

(52) U.S. Cl.
CPC ............ *G11C 5/06* (2013.01); *H01L 23/5226* (2013.01); *H01L 23/5283* (2013.01); *H10B 41/27* (2023.02); *H10B 43/27* (2023.02)

(58) Field of Classification Search
CPC ... G11C 5/06; H01L 23/5226; H01L 23/5283; H01L 24/80; H10B 41/27; H10B 43/27; H10B 43/10; H10B 43/40; H10B 80/00

USPC ........................................................ 257/314
See application file for complete search history.

(56) References Cited

U.S. PATENT DOCUMENTS

| | | |
|---|---|---|
| 10,354,987 B1 | 7/2019 | Mushiga et al. |
| 2016/0079164 A1 | 3/2016 | Fukuzumi et al. |
| 2019/0287955 A1* | 9/2019 | Iijima ............. H01L 24/80 |
| 2020/0395341 A1 | 12/2020 | Maejima et al. |
| 2021/0320114 A1 | 10/2021 | Lee |
| 2022/0310613 A1* | 9/2022 | Okajima ........... H10B 12/50 |

FOREIGN PATENT DOCUMENTS

JP        6203152 B2    9/2017

\* cited by examiner

*Primary Examiner* — Theresa T Doan
(74) *Attorney, Agent, or Firm* — Foley & Lardner LLP

(57) ABSTRACT

A semiconductor memory device includes a first chip, a second chip, and a multiple of bonding pads. The first chip has a multiple of memory pillars that penetrate a multiple of wiring layers in a first direction. The second chip is bonded to the first chip. The multiple of bonding pads are provided at a bonding face between the first chip and the second chip. The multiple of bonding pads include a first bonding pad that electrically connects a first memory pillar among the multiple of memory pillars to one of a multiple of transistors, and a second bonding pad that neighbors the first bonding pad when seen from the first direction, and which electrically connects a second memory pillar among the multiple of memory pillars to one of the multiple of transistors. The second memory pillar does not neighbor the first memory pillar when seen from the first direction.

18 Claims, 9 Drawing Sheets

SEMICONDUCTOR MEMORY DEVICE

CROSS-REFERENCE TO RELATED APPLICATION(S)

This application is based upon and claims the benefit of priority from Japanese Patent Application No. 2022-047336, filed Mar. 23, 2022, the entire contents of which are incorporated herein by reference.

FIELD

Embodiments described herein relate generally to a semiconductor memory device.

BACKGROUND

A semiconductor memory device including multiple semiconductor chips connected via multiple bonding pads is known.

DETAILED DESCRIPTION

At least one embodiment provides a semiconductor memory device such that a short circuit failure between bonding pads and a short circuit failure between memory pillars can easily be distinguished between.

In general, according to at least one embodiment, a semiconductor memory device has a first chip, a second chip, and a multiple of bonding pads. The first chip has a multiple of wiring layers stacked in a first direction and a multiple of memory pillars penetrating the multiple of wiring layers in the first direction. The second chip has a semiconductor substrate and a multiple of transistors provided on the semiconductor substrate, and is bonded to the first chip. The multiple of bonding pads are provided at a bonding face between the first chip and the second chip. The multiple of bonding pads include a first bonding pad that electrically connects a first memory pillar among the multiple of memory pillars to one of the multiple of transistors, and a second bonding pad that neighbors the first bonding pad when seen from the first direction, and which electrically connects a second memory pillar among the multiple of memory pillars to one of the multiple of transistors. The second memory pillar does not neighbor the first memory pillar when seen from the first direction.

Hereafter, embodiments will be described with reference to the drawings.

Figure 1:
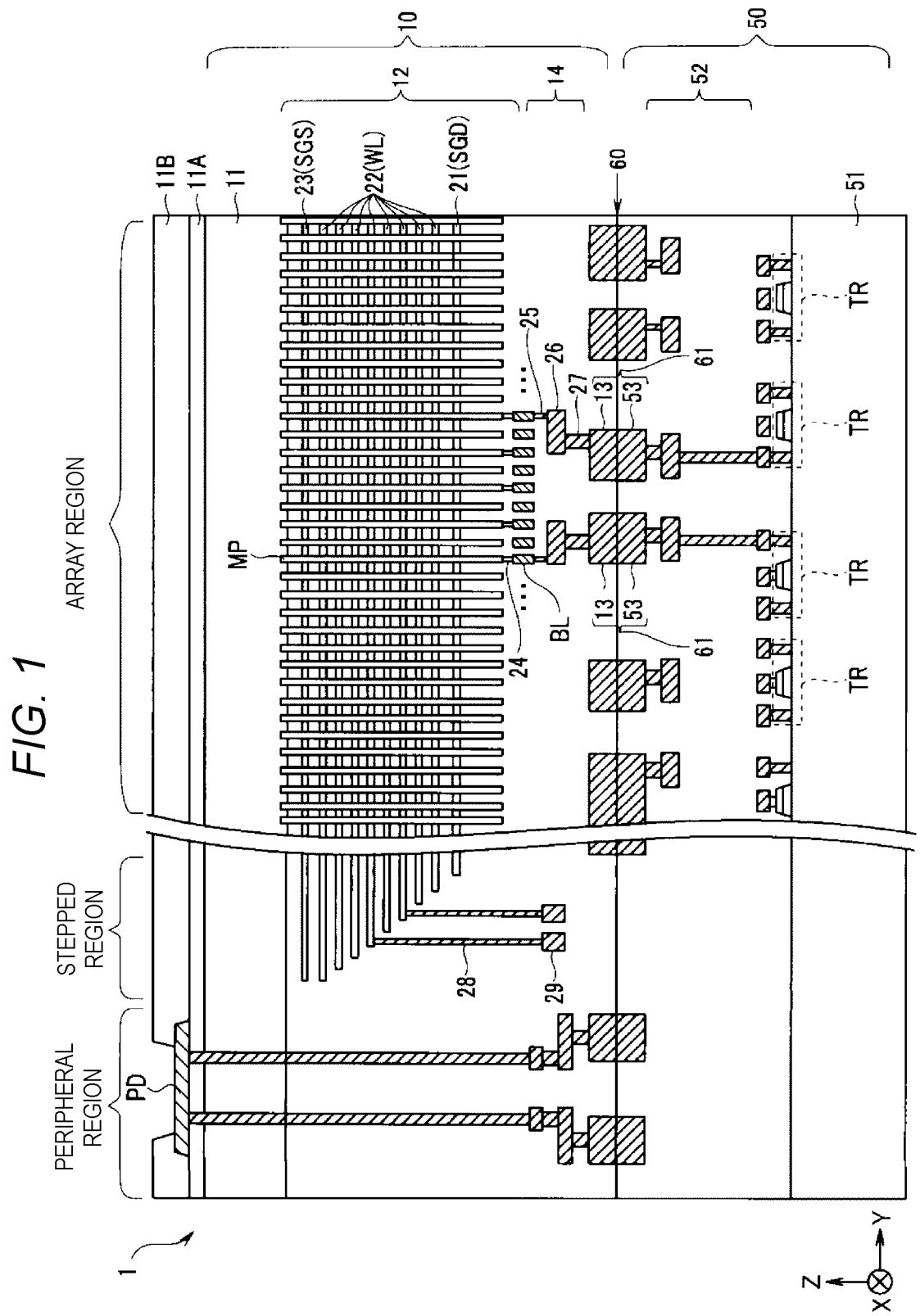
FIG. 1 is a sectional view showing one example of a configuration of a semiconductor memory device according to a first embodiment.

FIG. 1 is a sectional view showing one example of a configuration of a semiconductor memory device according to a first embodiment. As shown in FIG. 1, a semiconductor memory device 1 has a structure wherein an array chip 10, on which a memory cell array is formed, and a circuit chip 50, on which a control circuit that controls the memory cell array is formed, are bonded together. The array chip 10 configures a first chip, and the circuit chip 50 configures a second chip.

The semiconductor memory device 1 is manufactured by the array chip 10 including the memory cell array being formed on a first wafer, the circuit chip 50 including the control circuit being formed on the second wafer, the first and second wafers being bonded together, and the bonded first and second wafers being diced. The semiconductor memory device 1 may also be manufactured by the array chip 10 configuring the first chip and the circuit chip 50 configuring the second chip being bonded together after the first and second wafers are individually diced.

The array chip 10 has a semiconductor substrate 11, a memory cell array 12 including a multiple of memory cells formed on the semiconductor substrate 11 (in a −Z direction), a multiple of bonding pads 13, and a wiring layer 14 that connects the memory cell array 12 and the bonding pads 13.

The memory cell array 12 includes a wiring layer 21, which is a select gate line SGD, wiring layers 22, which are word lines WL, and a wiring layer 23, which is a select gate line SGS. That is, the multiple of wiring layers 21, 22, and 23 are stacked in a Z direction (a first direction). For the sake of convenience, a structure wherein eight of the wiring layers 22 functioning as the word lines WL are stacked is shown in FIG. 1, but still more wiring layers may be stacked. Further, a multiple of memory holes penetrating the wiring layers 21, 22, and 23 and reaching the semiconductor substrate 11 are formed. A block insulating film, a charge storage layer, and a tunnel insulating film are formed sequentially on side faces of the memory holes, and furthermore, a semiconductor pillar is embedded. A memory pillar MP is configured with the semiconductor pillar, the tunnel insulating film, the charge storage layer, and the block insulating film. An insulating core may be embedded in an interior of the semiconductor pillar.

Each memory pillar MP is electrically connected via a contact plug 24 to one of a multiple of bit lines BL extending in an X direction (a second direction) intersecting the Z direction. The multiple of bit lines BL are arranged in a Y direction (a third direction) intersecting the Z direction and the X direction. Each bit line BL is electrically connected to one of the bonding pads 13 via a via plug 25, a wiring layer 26, and a via plug 27. The bonding pads 13 are electrically connected to bonding pads 53 of the opposing circuit chip 50.

The array chip 10 includes an array region, a stepped region, and a peripheral region. The memory cell array 12 is formed in the array region. The wiring layers 22 are formed in a stepped form in the stepped region. Each wiring layer 22 is electrically connected to a wiring layer 29 via a via plug 28 in the stepped region.

An insulating layer 11A is formed on a Z-direction upper face of the semiconductor substrate 11 of the array chip 10. A passivation film 11B is formed on a Z-direction upper face of the insulating layer 11A. The passivation film 11B is an insulating film such as a silicon dioxide film. An aperture that causes an upper face of an electrode pad PD to be exposed is provided in the passivation film 11B.

The electrode pad PD functions as an external connection pad (a bonding pad) of the semiconductor memory device 1. The electrode pad PD is connected to a mounting substrate or other device via the aperture formed in the passivation film 11B using bonding wire, a solder ball, a metal bump, or the like.

Various kinds of circuit for controlling the array chip 10, that is, for controlling a writing and an erasing of data into and from the memory cells, a reading of data from the memory cells, and the like, are formed on the circuit chip 50. For example, a logic control circuit, a sense amplifier, a row decoder, a register, a sequencer, a voltage generating circuit, and the like, are formed on the circuit chip 50.

Also, the circuit chip 50 includes a multiple of transistors TR configuring various kinds of circuit, a wiring layer 52, and the bonding pads 53 on a semiconductor substrate 51. Gate electrodes, sources, and drains of the multiple of transistors TR are electrically connected to one of the bonding pads 53 via the wiring layer 52. The bonding pads 53 are electrically connected to the bonding pads 13 of the opposing array chip 10.

The array chip 10 and the circuit chip 50 are joined at a bonding face 60 using heat treatment. The bonding pad 13 and the bonding pad 53 are joined by the heat treatment, whereby a bonding pad 61 is formed at the bonding face 60. As a result, multiple bonding pads 61 are provided at the bonding face 60 of the array chip 10 and the circuit chip 50.

Figure 2:
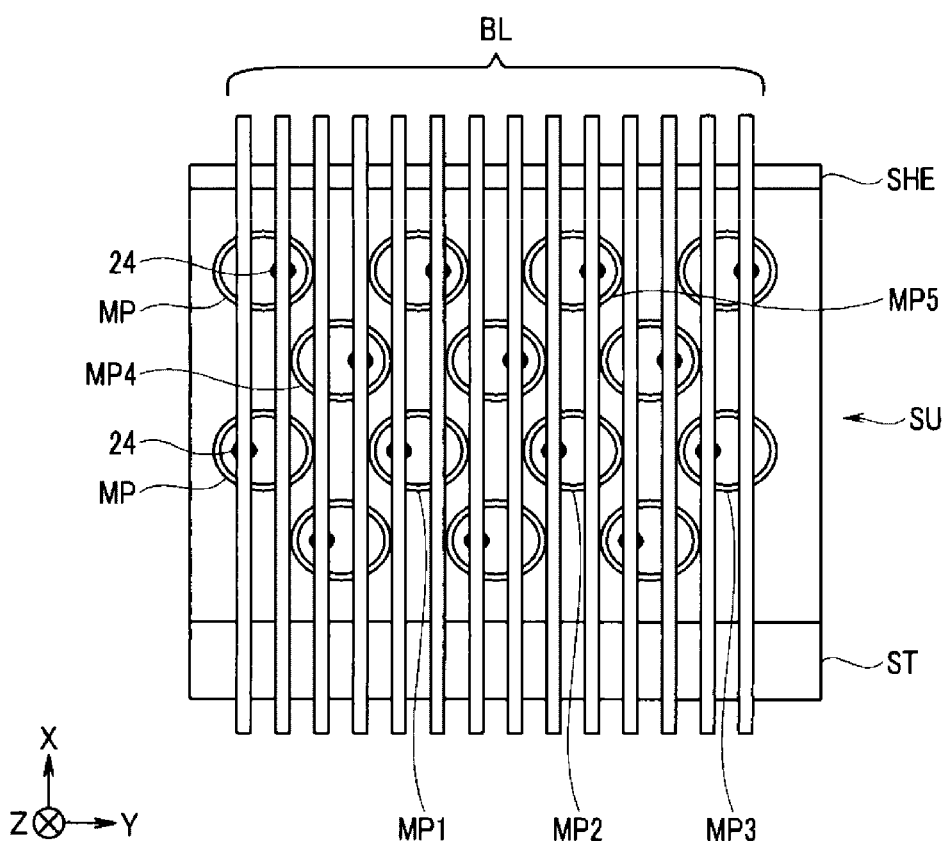
FIG. 2 is a drawing illustrating a connection relationship between memory pillars and bit lines.

FIG. 2 is a drawing illustrating a connection relationship between memory pillars and bit lines.

The memory cell array 12 is configured with a multiple of blocks BLK. An insulating layer ST shown in FIG. 2 isolates one block BLK from another block BLK. One block BLK includes a multiple of string units SU isolated by an insulating layer SHE. The insulating layer SHE is extended as far as the wiring layer 21 configuring the select gate line SGD, thereby isolating individual string units SU from each other.

A multiple of memory pillars MP are disposed staggered in the string unit SU. Each memory pillar MP is connected to one bit line BL via the contact plug 24.

The bit line BL connected to a memory pillar MP1, and the bit line BL connected to a memory pillar MP4 neighboring the memory pillar MP1, are neighboring. Also, the bit line BL connected to the memory pillar MP1 and the bit line BL connected to a memory pillar MP2 neighboring the memory pillar MP1 are four bit lines away from each other. When an interval between bit lines BL is within four bit lines in this way, the memory pillars MP connected to those bit lines BL are neighboring.

Meanwhile, the bit line BL connected to the memory pillar MP1 and the bit line BL connected to a memory pillar MP5, which does not neighbor the memory pillar MP1, are five bit lines away from each other. Also, the bit line BL connected to the memory pillar MP1 and the bit line BL connected to a memory pillar MP3, which does not neighbor the memory pillar MP1, are eight bit lines away from each other. When an interval between bit lines BL is five bit lines or greater in this way, the memory pillars MP connected to those bit lines BL are not neighboring.

Figure 3:
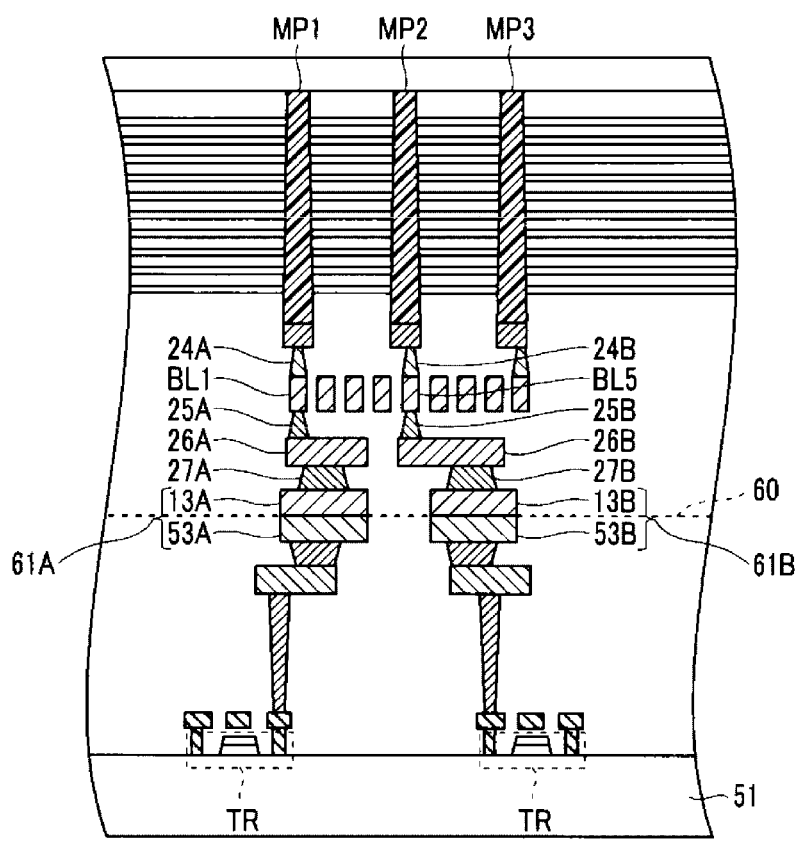
FIG. 3 is a sectional view showing a connection relationship between bonding pads and memory pillars according to a comparative example.

FIG. 3 is a sectional view showing a connection relationship between bonding pads and memory pillars according to a comparative example. A configuration shown in FIG. 3 is a schematic view showing an electrical connection.

A structure shown in FIG. 3 is such that a bonding pad 61A formed of a bonding pad 13A and a bonding pad 53A, and a bonding pad 61B formed of a bonding pad 13B and a bonding pad 53B, are neighboring bonding pads. Also, memory pillars MP1 and MP2 are neighboring memory pillars. Furthermore, memory pillars MP2 and MP3 are neighboring memory pillars. Meanwhile, the memory pillars MP1 and MP3 are non-neighboring memory pillars.

The configuration of the comparative example is such that the bonding pad 61A is connected to a bit line BL1 via a via plug 27A, a wiring layer 26A, and a via plug 25A. The bit line BL1 is connected to the memory pillar MP1 via a contact plug 24A.

Also, the bonding pad 61B neighboring the bonding pad 61A is connected to a bit line BL5 four bit lines away from the bit line BL1 via a via plug 27B, a wiring layer 26B, and a via plug 25B. The bit line BL5 is connected to the memory pillar MP2 via a contact plug 24B.

As described above, when an interval between bit lines BL (the number of bit lines away from each other) is within four bit lines, the memory pillars MP connected to those bit lines BL are neighboring. That is, in the case of the configuration of the comparative example, the neighboring bonding pads 61A and 61B are connected to the neighboring memory pillars MP1 and MP2, respectively. When a short circuit failure occurs when evaluating electrical characteristics, the configuration of the comparative example is such that it cannot be determined whether the short circuit failure occurred between the neighboring bonding pads 61A and 61B or between the neighboring memory pillars MP1 and MP2.

Figure 4:
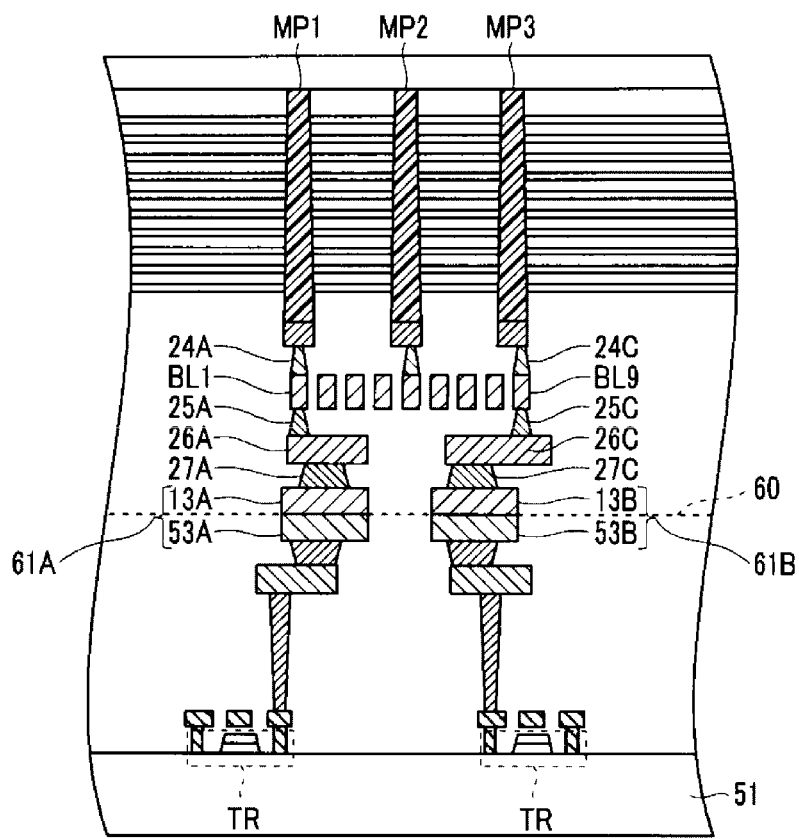
FIG. 4 is a sectional view showing a connection relationship between bonding pads and memory pillars according to the first embodiment.

FIG. 4 is a sectional view showing a connection relationship between bonding pads and memory pillars according to the first embodiment. A configuration shown in FIG. 4 is a schematic view showing an electrical connection. Also, in FIG. 4, identical reference signs are allotted to configurations which are the same as those in FIG. 3, and a description thereof will be omitted.

As shown in FIG. 4, a configuration of at least one embodiment is such that the bonding pad 61B neighboring the bonding pad 61A is connected to a bit line BL9, which is eight bit lines away from the bit line BL1, via a via plug 27C, a wiring layer 26C, and a via plug 25C. More specifically, the multiple of bit lines BL have the bit line BL1, which connects the memory pillar MP1 to the bonding pad 61A, and the bit line BL9, which connects the memory pillar MP3 to the bonding pad 61B. Further, seven or more of the multiple of bit lines BL are arranged between the bit lines BL1 and BL9 in the Y direction. As described above, when an interval between bit lines BL is five bit lines or greater, the memory pillars MP connected to those bit lines BL are not neighboring. This means that due to the bit lines BL1 and BL9, wherein the interval between the bit lines is five bit lines or greater, being connected to the neighboring bonding pads 61A and 61B, the neighboring bonding pads 61A and 61B are connected to the non-neighboring memory pillars MP1 and MP3, respectively.

This kind of configuration of at least one embodiment is such that when a short circuit failure occurs when evaluating electrical characteristics, it can be determined whether the short circuit failure occurred between the neighboring memory pillars MP1 and MP2 or between the neighboring bonding pads 61A and 61B. For example, when a failure occurs in electrical characteristics between the bonding pads 61A and 61B, it can be determined that the failure is a short circuit failure between the bonding pads 61A and 61B because the memory pillars MP1 and MP3 connected to the bonding pads 61A and 61B are not neighboring.

Figure 5:
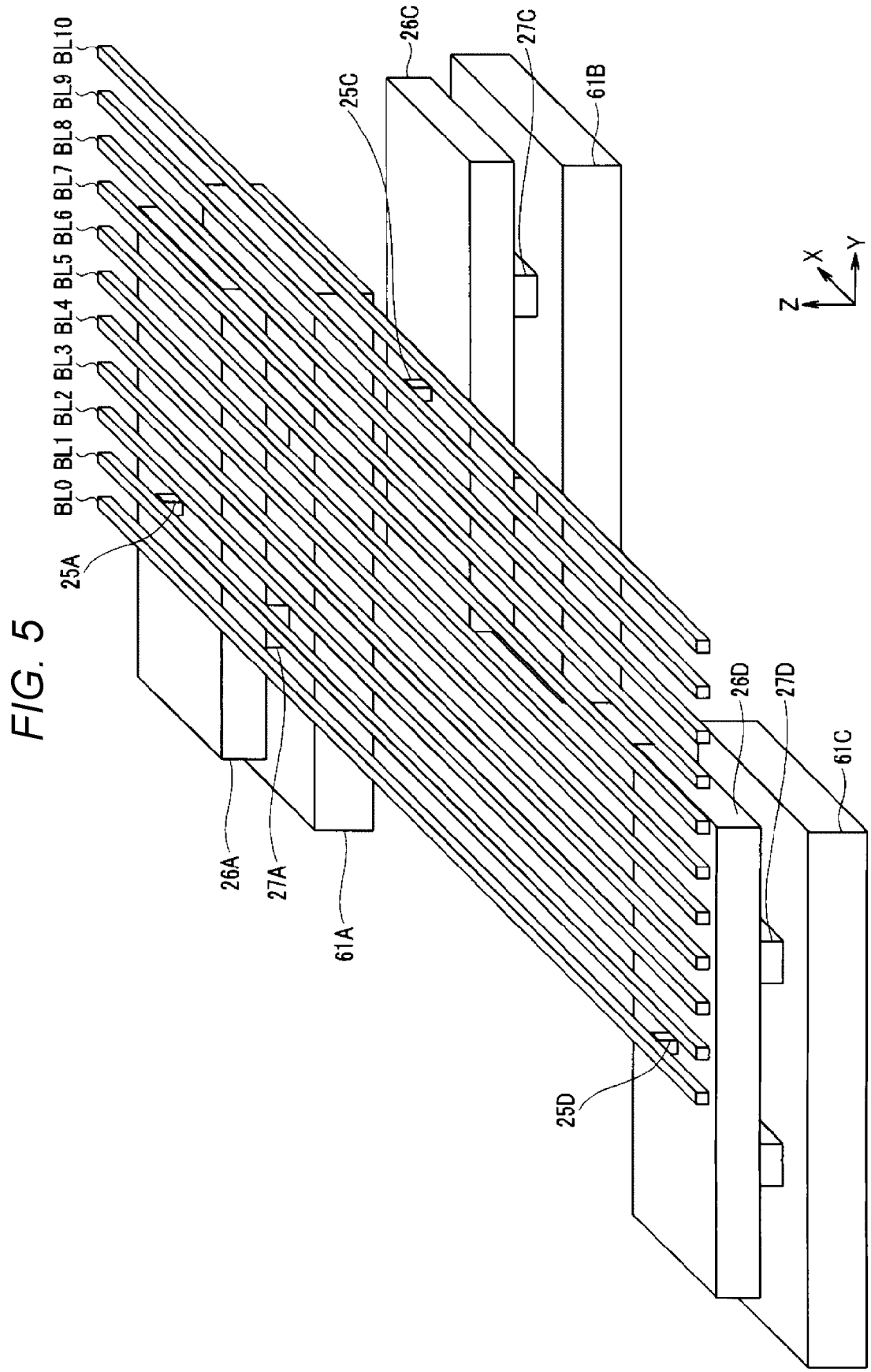
FIG. 5 is a perspective view showing one example of a connection relationship between bonding pads and bit lines according to the first embodiment.
Figure 6:
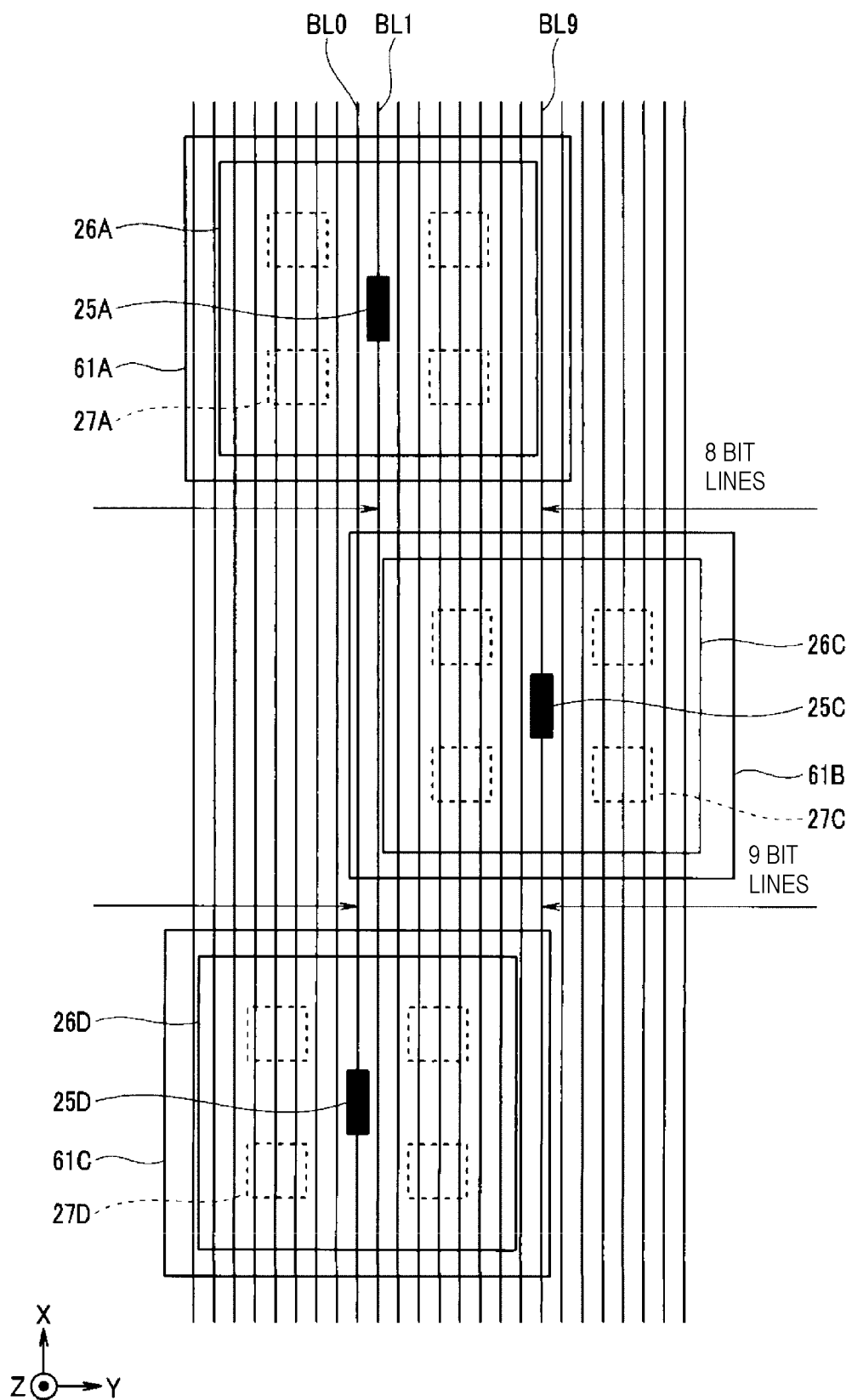
FIG. 6 is a top view showing one example of a connection relationship between bonding pads and bit lines according to the first embodiment.

FIG. 5 is a perspective view showing one example of a connection relationship between bonding pads and bit lines according to the first embodiment. FIG. 6 is a top view showing one example of a connection relationship between bonding pads and bit lines according to the first embodiment.

As shown in FIGS. 5 and 6, the bonding pad 61A is connected to the bit line BL1 via the via plug 27A, the wiring layer 26A, and the via plug 25A.

The bonding pad 61B neighboring the bonding pad 61A is disposed moved in the Y direction (the third direction) with respect to the bonding pad 61A. Because of this, the bonding pad 61B is connected to the bit line BL9, which is eight bit lines away from the bit line BL1, via the via plug 27C, the wiring layer 26C, and the via plug 25C.

A bonding pad 61C is neighboring the bonding pad 61B. The bonding pad 61C neighboring the bonding pad 61B is disposed moved in a −Y direction (a fourth direction) with respect to the bonding pad 61B. Because of this, the bonding pad 61C is connected to a bit line BL0, which is nine bit lines away from the bit line BL9, via a via plug 27D, a wiring layer 26D, and a via plug 25D.

Although omitted from the drawings, the bonding pad 61 neighboring the bonding pad 61C is disposed moved in the Y direction with respect to the bonding pad 61C, and is connected to a bit line BL8 that is nine bit lines away from the bit line BL0.

In this way, neighboring bonding pads 61 are connected to bit lines BL leaving an interval of eight bit lines or greater. As a result of this, the neighboring bonding pads 61 are connected to non-neighboring memory pillars MP, because of which distinguishing between a short circuit failure between the bonding pads 61 and a short circuit failure between the memory pillars MP is easy.

Figure 7:
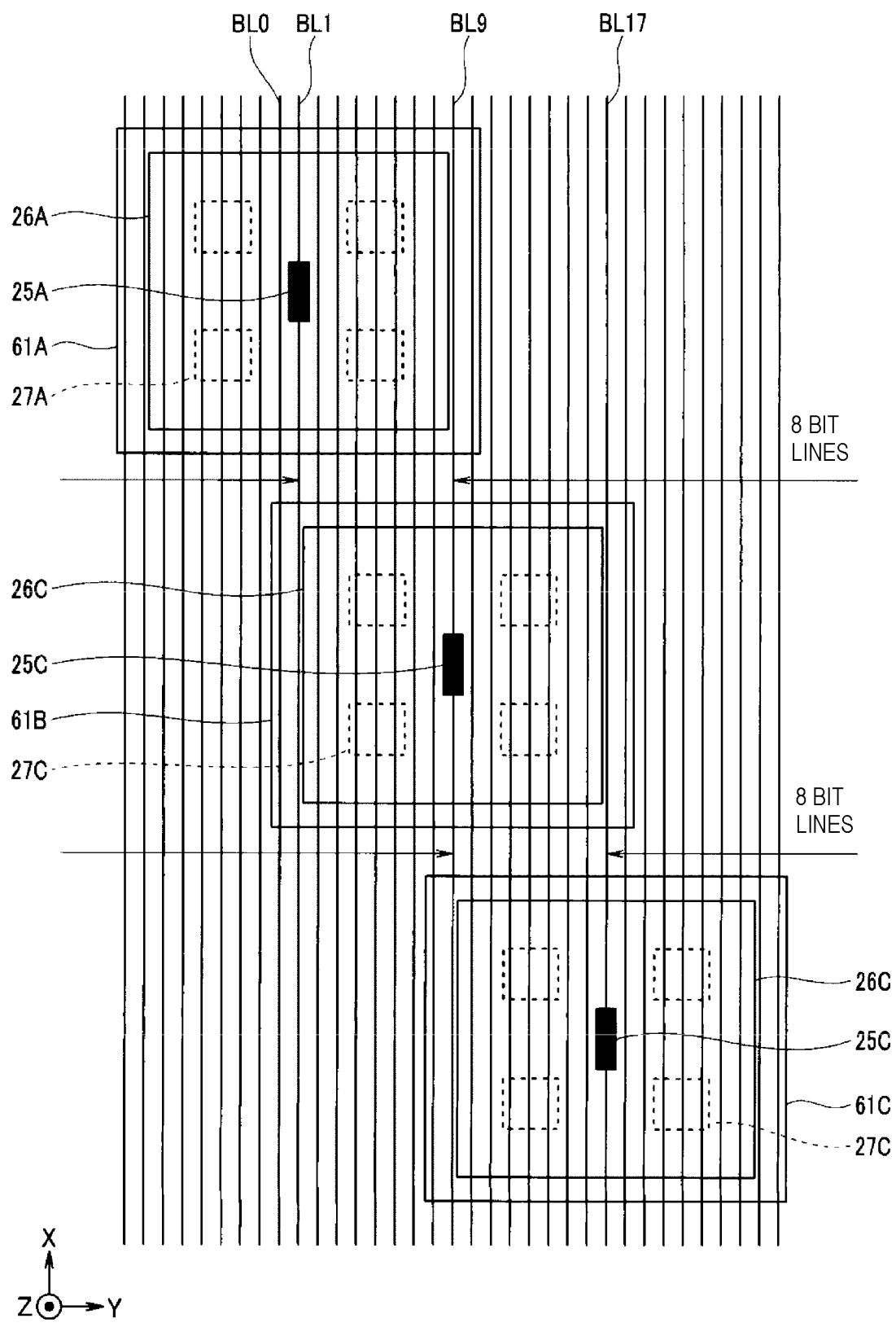
FIG. 7 is a top view showing one example of a connection relationship between bonding pads and bit lines according to a first modification of the first embodiment.
Figure 8:
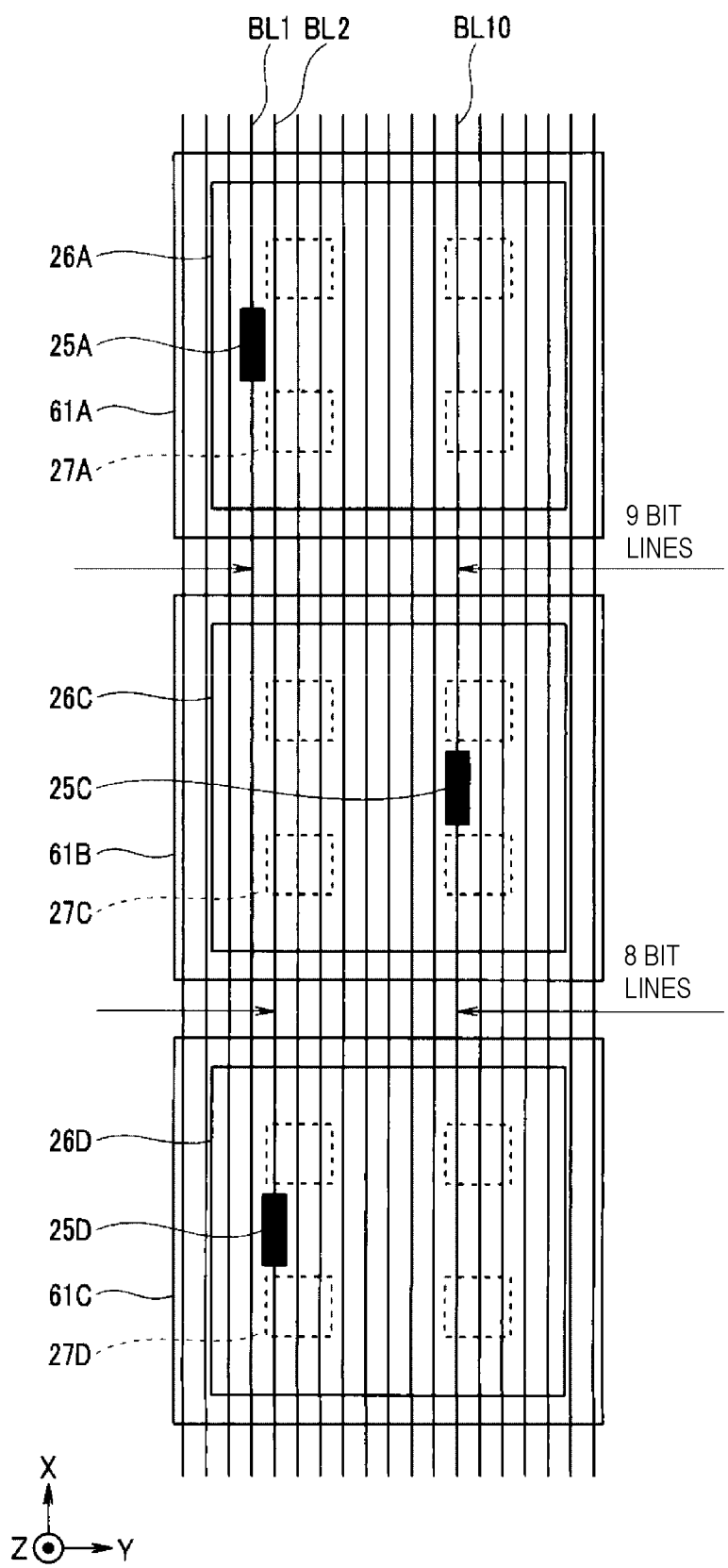
FIG. 8 is a top view showing one example of a connection relationship between bonding pads and bit lines according to a second modification of the first embodiment.

Connection of the bonding pads 61 and the bit lines BL is not limited to the connection relationship shown in FIG. 6. FIG. 7 is a top view showing one example of a connection relationship between bonding pads and bit lines according to a first modification of the first embodiment. FIG. 8 is a top view showing one example of a connection relationship between bonding pads and bit lines according to a second modification of the first embodiment.

First Modification

As shown in FIG. 7, the bonding pad 61A is connected to the bit line BL1 via the via plug 27A, the wiring layer 26A, and the via plug 25A.

The bonding pad 61B neighboring the bonding pad 61A is disposed moved in the Y direction with respect to the bonding pad 61A. Because of this, the bonding pad 61B is connected to the bit line BL9, which is eight bit lines away from the bit line BL1, via the via plug 27C, the wiring layer 26C, and the via plug 25C.

The bonding pad 61C neighboring the bonding pad 61B is disposed in the Y direction with respect to the bonding pad 61B. Because of this, the bonding pad 61C is connected to a bit line BL17, which is eight bit lines away from the bit line BL9, via the via plug 27D, the wiring layer 26D, and the via plug 25D.

For example, eight bonding pads 61 are assumed to be one set. Further, the bonding pad 61 nine bonding pads away from the bonding pad 61A is connected to the bit line BL0.

Subsequently, the neighboring bonding pad 61 is connected to the bit line BL eight bit lines away from the bit line BL0.

According to the configuration of the first modification, neighboring bonding pads 61 are connected to non-neighboring memory pillars MP, because of which distinguishing between a short circuit failure between the bonding pads 61 and a short circuit failure between the memory pillars MP is easier.

Second Modification

A configuration shown in FIG. 8 is such that an interval between bit lines BL to be connected is eight bit lines or greater owing to positions of the via plugs 25A, 25C, and 25D being shifted, without shifting positions of the bonding pads 61A, 61B, and 61C.

The via plug 25A is disposed in a first position on the wiring layer 26A. Because of this, the bonding pad 61A is connected to the bit line BL1. The configuration of FIG. 8 is such that although a position of the bit line BL1 is changed from that in the configuration of FIG. 7, the bit line connected to the via plug 25A is assumed to be the bit line BL1 in FIG. 8, and the bit lines disposed to the right side from the bit line BL1 are assumed to be the bit lines BL2, BL3, and so on, in order.

The via plug 25C is disposed in a second position on the wiring layer 26C. The second position is a position shifted in the Y direction with respect to the first position in order that connection is made to a bit line BL10, which is nine bit lines away from the bit line BL1. Because of this, the bonding pad 61B neighboring the bonding pad 61A is connected to the bit line BL10, which is nine bit lines away from the bit line BL1, via the via plug 27C, the wiring layer 26C, and the via plug 25C.

The via plug 25D is disposed in a third position on the wiring layer 26D. The third position is a position shifted in the −Y direction with respect to the second position in order that connection is made to the bit line BL2, which is eight bit lines away from the bit line BL10. Because of this, the bonding pad 61C neighboring the bonding pad 61B is connected to the bit line BL2, which is eight bit lines away from the bit line BL10, via the via plug 27D, the wiring layer 26D, and the via plug 25D.

For example, sixteen bonding pads 61 are assumed to be one set, and the via plug 25 is shifted. Further, disposition positions are shifted in the Y direction every sixteen bonding pads 61, and connection is made to the bit lines BL.

According to the configuration of the second modification, neighboring bonding pads 61 are connected to non-neighboring memory pillars MP, because of which distinguishing between a short circuit failure between the bonding pads 61 and a short circuit failure between the memory pillars MP is easier.

Second Embodiment

Next, a second embodiment will be described.

In the first embodiment, a configuration wherein neighboring bonding pads 61 are connected to non-neighboring memory pillars MP is described. In the second embodiment, a configuration wherein non-neighboring bonding pads 61 are connected to neighboring memory pillars MP will be described.

Figure 9:
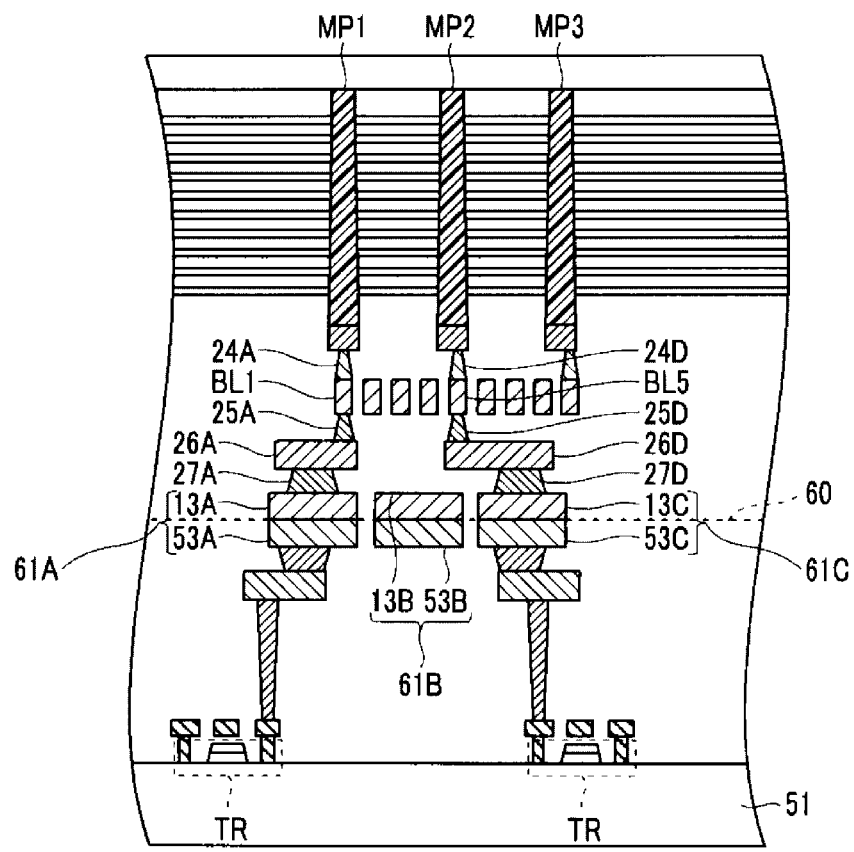
FIG. 9 is a sectional view showing a connection relationship between bonding pads and memory pillars according to a second embodiment.

FIG. 9 is a sectional view showing a connection relationship between bonding pads and memory pillars according to the second embodiment. In FIG. 9, identical reference signs are allotted to configurations the same as those in FIG. 4, and a description thereof will be omitted.

As shown in FIG. 9, the bonding pad 61A is formed of the bonding pads 13A and 53A, the bonding pad 61B is formed of the bonding pads 13B and 53B, and the bonding pad 61C is formed of bonding pads 13C and 53C, at the bonding face 60.

The bonding pads 61A and 61B are neighboring bonding pads. Also, the bonding pads 61B and 61C are neighboring bonding pads. The bonding pads 61A and 61C are non-neighboring bonding pads.

The configuration of at least one embodiment is such that the bonding pad 61C, which is not neighboring the bonding pad 61A, is connected via the via plug 27D, the wiring layer 26D, and the via plug 25D to the bit line BL5, which is four bit lines away from the bit line BL1. As heretofore described, when an interval between bit lines BL is within four bit lines, the memory pillars MP connected to those bit lines BL are neighboring. This means that owing to the bit lines BL1 and BL5, wherein the interval between the bit lines BL is within four bit lines, being connected to the non-neighboring bonding pads 61A and 61C, the non-neighboring bonding pads 61A and 61C are connected to the neighboring memory pillars MP1 and MP2, respectively.

This configuration of at least one embodiment is such that when a short circuit failure occurs when evaluating electrical characteristics, it can be determined whether the short circuit failure occurred between the neighboring memory pillars MP1 and MP2 or between the neighboring bonding pads 61A and 61B. For example, when a failure occurs in electrical characteristics between the non-neighboring bonding pads 61A and 61C, it can be determined that the failure is a short circuit failure between the neighboring memory pillars MP1 and MP2 connected to the bonding pads 61A and 61C.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
a first chip having a plurality of wiring layers stacked in a first direction, and a plurality of memory pillars extending into the plurality of wiring layers in the first direction;
a second chip having a semiconductor substrate and a plurality of transistors provided on the semiconductor substrate, the second chip bonded to the first chip; and
a plurality of bonding pads provided at a bonding face between the first chip and the second chip, wherein
the plurality of bonding pads include:
a first bonding pad electrically connecting a first memory pillar among the plurality of memory pillars to one of the plurality of transistors, and
a second bonding pad adjacent the first bonding pad when seen from the first direction, the second bonding pad electrically connecting a second memory pillar among the plurality of memory pillars to one of the plurality of transistors, and
wherein the second memory pillar is not adjacent the first memory pillar when seen from the first direction.

2. The semiconductor memory device according to claim 1, wherein
the first chip further includes a plurality of bit lines disposed below the plurality of memory pillars, the plurality of bit lines (i) extending in a second direction intersecting the first direction, and (ii) arranged in a third direction intersecting the first direction and the second direction,
the plurality of bit lines having (i) a first bit line connecting the first memory pillar to the first bonding pad and (ii) a second bit line connecting the second memory pillar to the second bonding pad, and
at least seven of the plurality of bit lines arranged between the first bit line and the second bit line in the third direction.

3. The semiconductor memory device according to claim 2, wherein
the plurality of bonding pads are disposed sequentially in the third direction, and in a fourth direction opposite to the third direction, such that the at least seven bit lines are arranged between the bit lines to which the bonding pads are connected.

4. The semiconductor memory device according to claim 2, wherein
multiple bonding pads are disposed sequentially in the third direction such that the at least seven bit lines are arranged between the bit lines to which the bonding pads are connected.

5. The semiconductor memory device according to claim 2, wherein
each of the plurality of bonding pads is connected to a respective one of the plurality of bit lines via a first via plug, a wiring layer, and a second via plug, and
the second via plugs connected to the adjacent abonding pads are disposed in the wiring layer such that that the at least seven bit lines are arranged between the bit lines to which the second via plugs are connected.

6. The semiconductor memory device according to claim 1, wherein
the first chip is an array chip including a memory cell array, and
the second chip is a circuit chip including a control circuit configured to control the array chip.

7. A semiconductor memory device, comprising:
a first chip having a plurality of wiring layers stacked in a first direction and a plurality of memory pillars penetrating the plurality of wiring layers in the first direction;
a second chip having a semiconductor substrate and a plurality of transistors provided on the semiconductor substrate, the second chip being bonded to the first chip; and
a plurality of bonding pads provided at a bonding face between the first chip and the second chip, wherein
the plurality of bonding pads include:
a first bonding pad electrically connecting a first memory pillar among the plurality of memory pillars to one of the plurality of transistors, and
a second bonding pad electrically connecting a second memory pillar among the plurality of memory pillars, the second bonding pad adjacent the first memory pillar when seen from the first direction, to one of the plurality of transistors, and
wherein the second bonding pad is not adjacent the first bonding pad when seen from the first direction.

8. The semiconductor memory device according to claim 6, wherein the first chip includes an array region including the memory cell array, a stepped region, and a peripheral region.

9. The semiconductor memory device according to claim 8, wherein the plurality of wiring layers are disposed in the stepped region.

10. The semiconductor memory device according to claim 1, where each of the plurality of memory pillars includes a semiconductor pillar.

11. The semiconductor memory device according to claim 10, where each of the plurality of memory pillars includes a charge storage layer.

12. The semiconductor memory device according to claim 1, where the plurality of wiring layers include word lines.

13. The semiconductor memory device according to claim 7, wherein
the first chip is an array chip including a memory cell array, and
the second chip is a circuit chip including a control circuit configured to control the array chip.

14. The semiconductor memory device according to claim 13, wherein the first chip includes an array region including the memory cell array, a stepped region, and a peripheral region.

15. The semiconductor memory device according to claim 14, wherein the plurality of wiring layers are disposed in the stepped region.

16. The semiconductor memory device according to claim 7, where each of the plurality of memory pillars includes a semiconductor pillar.

17. The semiconductor memory device according to claim 16, where each of the plurality of memory pillars includes a charge storage layer.

18. The semiconductor memory device according to claim 7, where the plurality of wiring layers include word lines.

* * * * *